United States Patent
Yamada

(10) Patent No.: US 6,604,970 B1
(45) Date of Patent: Aug. 12, 2003

(54) METHODS FOR PRODUCING ELECTRON SOURCE, IMAGE-FORMING APPARATUS, AND WIRING SUBSTRATE HAVING A STACK OF INSULATING LAYERS; AND ELECTRON SOURCE, IMAGE-FORMING APPARATUS, AND WIRING SUBSTRATE PRODUCED USING THE METHODS

(75) Inventor: Shuji Yamada, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/456,285

(22) Filed: Dec. 8, 1999

(30) Foreign Application Priority Data

Feb. 23, 1999 (JP) .............................. 11-044418
Nov. 22, 1999 (JP) .......................... 11-331214

(51) Int. Cl.⁷ .............................. H01J 9/00; H01J 9/24
(52) U.S. Cl. .......................... 445/24; 445/25; 313/495; 313/496; 313/497
(58) Field of Search ................................ 313/495, 496, 313/497; 445/24, 25

(56) References Cited

U.S. PATENT DOCUMENTS

| | | | |
|---|---|---|---|
| 5,839,363 A | 11/1998 | Yanagisawa et al. | ........ 101/123 |
| 5,996,488 A | 12/1999 | Yanagisawa et al. | ........ 101/170 |
| 6,087,770 A | 7/2000 | Kaneko et al. | ............. 313/495 |

FOREIGN PATENT DOCUMENTS

| | | | | |
|---|---|---|---|---|
| JP | 8-34110 | 2/1996 | | |
| JP | 8-185818 | 7/1996 | | |
| JP | 8-236017 | 9/1996 | | |
| JP | 09283010 A | * 10/1997 | ............. | H01J/9/02 |
| JP | 9-283061 | 10/1997 | | |
| JP | 09283061 A | * 10/1997 | ............. | H01J/9/02 |

OTHER PUBLICATIONS

H. Araki, et al., "Elecroforming and Electron Emission of Carbon Thin Films", pp. 22–29 (Jan. 26, 1983).

G. Dittmer, "Electrical Conduction and Electron Emission of Discontinuous Thin Films", Thin Solid Films, 9, pp. 317–328 (1972).

M.I. Elinson, et al., "The Emission of Hot Electrons and the Field Emission of Electrons From Tin Oxide", Radio Engineering and Electronic Physics, pp. 1290–1296 (1965).

M. Hartwell, et al., "Strong Electron Emission From Patterned Tin–Indium Oxide Thin Films", International Electron Devices Meeting, pp. 519–521 (1975).

* cited by examiner

*Primary Examiner*—Kenneth J. Ramsey
*Assistant Examiner*—Mariceli Santiago
(74) *Attorney, Agent, or Firm*—Fitzpatrick, Cella, Harper & Scinto

(57) ABSTRACT

A production method of an insulating layer includes a step of forming a first wire, a step of forming an insulating layer as a stack of M layers by repeatedly carrying out steps of laying and baking an insulating material on the first wire M times (M is an integer satisfying $M \geq 3$), and a step of forming a second wire on the insulating layer. An N-th insulating material used in formation of the N-th insulating layer (N is an integer satisfying $2 \leq N \leq M-1$) is baked at a temperature lower than a softening point of the N-th insulating material, and baking temperatures in formation of the (N+1)th to the M-th insulating layers are not more than the baking temperature in formation of the N-th insulating layer.

23 Claims, 11 Drawing Sheets

INSULATING LAYER

METHODS FOR PRODUCING ELECTRON SOURCE, IMAGE-FORMING APPARATUS, AND WIRING SUBSTRATE HAVING A STACK OF INSULATING LAYERS; AND ELECTRON SOURCE, IMAGE-FORMING APPARATUS, AND WIRING SUBSTRATE PRODUCED USING THE METHODS

BACKGROUND OF THE INVENTION

1. Field of the Invention

The present invention relates to methods for producing an electron source, an image-forming apparatus, and a wiring substrate, and to the electron source, the image-forming apparatus, and the wiring substrate produced using the production methods. Further, the invention concerns a method for forming an insulating layer for insulation between wires.

2. Related Background Art

In recent years the image-forming apparatus of a thin and flat type have been developed actively as display devices, because they were excellent in utilization of installation space. For example, liquid-crystal display devices are utilized as displays of portable personal computers or the like and thus already known well.

The liquid-crystal display devices, however, have the problems of dark images and narrow viewing angles. For this reason, emissive type displays have been drawing attention. Namely, the emissive type displays, such as plasma displays, vacuum fluorescent tubes, displays using the surface conduction electron-emitting devices, or the like, can present brighter images and wider viewing angles than the liquid-crystal display devices can.

Among such emissive type flat image-forming apparatus, attention is being drawn to the image-forming apparatus using the electron-emitting devices, particularly, to the image-forming apparatus using the surface conduction electron-emitting devices that permit emission of electrons in simple structure.

The surface conduction electron-emitting devices have been reported by M. I. Elinson et al. (Radio. Eng. Electron. Phys., 10, 1290, (1965)), and emission of electrons takes place when electric current is allowed to flow in parallel to the surface of a thin film of a small area formed on a substrate. Examples of the surface conduction electron-emitting devices include those using a thin film of $SnO_2$ by Elinson et al. cited above, those using a thin film of Au (G. Dittmer: Thin Solid Films, 9, 317 (1972)), those using a thin film of $In_2O_3/SnO_2$ (M. Hartwell and C. G. Fonstad: IEEE Trans. ED Conf., 519 (1975)), those using a thin film of carbon (Hisashi Araki et al.: Shinku, Vol. 26, No. 1, p22 (1983)), and so on.

FIGS. 4A and 4B show an example of the surface conduction electron-emitting device. FIG. 4A is a plan view of the structure of the device and FIG. 4B is a sectional view thereof. In these figures, numeral 201 designates an insulating substrate, 202 and 203 device electrodes for electric connection, 204 an electrically conductive, thin film, and 205 an electron-emitting region.

FIG. 6 is a schematic diagram to show an example of the image-forming apparatus using the electron source in which the surface conduction electron-emitting devices described above are arrayed in a matrix.

The structure of the device illustrated in FIGS. 4A and 4B is the structure of a unit element and the image-forming apparatus illustrated in FIG. 6 has the electron source in which a lot of such unit elements 5002 are arrayed on the substrate (rear plate) 5005 in correspondence to respective pixels. For permitting each device to be selected arbitrarily, X-directional wires 5003 and Y-directional wires 5004 are laid with an unrepresented, insulating layer in between on the substrate 5005, forming so-called matrix wiring. A glass is often used as the substrate 5005.

In the image-forming apparatus of FIG. 6, numeral 5006 denotes an outer frame, and 5007 a face plate. Each of connections between the outer frame 5006, the rear plate 5005, and the face plate 5007 is bonded (or sealed) with a bonding material such as a low-melting-point glass frit or the like not illustrated, thereby forming an airtight vessel 170 for maintaining the inside of the image display device under a vacuum.

A florescent film 5008 comprised of fluorescent substance is formed on the lower surface of the face plate 5007. A metal back 5009 of Al or the like is formed on the rear-plate-side surface of the fluorescent film 5008.

In the color display case, fluorescent materials (not illustrated) of the three primary colors, red (R), green (G), and blue (B), are laid separately. Further, a black material (not illustrated) is laid between the fluorescent materials of the respective colors forming the fluorescent film 5008.

The inside of the above airtight vessel is maintained in a vacuum of the pressure below $10^{-4}$ Pa. The distance between the rear plate 5005 with the electron-emitting devices formed thereon and the face plate 5007 with the fluorescent film formed thereon, as described above, is usually kept in the range of several hundred µm to several mm.

A method for driving the image-forming apparatus described above is as follows. A voltage is applied to each electron-emitting device 5002 via external terminals Dx1 to Dxm and Dy1 to Dyn and via the wires 5003, 5004, whereby each device 5002 emits electrons. At the same time as it, a high voltage of several hundred V to several kV is applied to the metal back 5009 via an external terminal Hv outside the vessel. This accelerates electrons emitted from each device 5002 to make them collide with the corresponding fluorescent material of each color. On this occasion, the fluorescent material is excited to emit light, thus displaying an image.

The electron source substrate (rear plate) provided with the above matrix wiring can be produced by a variety of production methods, one of which is a method of producing the device electrodes, wires, etc. all by photolithography.

The methods can also be selected from those of producing the electron source substrate by making use of printing techniques such as screen printing, offset printing, and so on. The printing methods are suitable for formation of large-area patterns and are very preferable, because they can readily form the array of many electron-emitting devices on the substrate.

For example, Japanese Patent Application Laid-Open Nos. 8-185818, 8-34110, 8-236017, 9-283061, etc., disclose the technology for producing the electron source substrate (rear plate) by the printing methods, the technology for forming the X-directional wires, interlayer insulating layer, and Y-directional wires by screen printing, and so on.

An example of the method of producing the electron source substrate, which is described in the above applications, will be described referring to FIGS. 7A to 7F.

First, pairs of device electrodes (202, 203) are formed in a matrix on the substrate (rear plate) 5005 (FIG. 7A). Then m X-directional wires 5003 are formed so as to connect the electrodes 202 in each column to a common wire, by printing a paste containing particles of an electroconductive material and baking it (FIG. 7B). Then insulating layers 5010 of a comb teeth shape are formed by printing a paste containing electrically insulating particles (glass particles) and baking it (FIG. 7C). Further, the Y-directional wires are formed on the respective insulating layers 5010 so as to connect the electrodes 203 in each row to a common wire, by printing a paste containing particles of an electroconductive material and baking it (FIG. 7D). Then electrically conductive films 204 are formed so that each film connects the device electrode 202 to the device electrode 203 (FIG. 7E). Finally, electric current is made to flow to the conductive films 204, whereby a gap is formed in part of each conductive film to form the electron-emitting region 205 (FIG. 7F).

SUMMARY OF THE INVENTION

Incidentally, in the case of the structure wherein the insulating layers are provided between the wires (at intersecting points), including the matrix wiring as disclosed in the above applications, the insulating layers need to have the insulation resistance of several MΩ or more between the upper and lower wires, as a matter of course. Therefore, no short should be allowed between the upper and lower wires because of a pinhole appearing in the insulating layer. It is, however, often the case to fail to prevent occurrence of the pinhole, particularly, where the insulating layers are formed using the printing methods. The "formation of insulating layers by the printing method" stated herein means a sequential process of applying an insulating material, such as glass particles or the like, and baking it to couple (sinter) the particles with each other, thereby forming electrically insulative films.

Particularly, in the case of the electron source substrate with the matrix wiring, used in the aforementioned image-forming apparatus, the electron-emitting devices need to be formed in the same number as the number of pixels. Therefore, the number of intersecting points between the upper and lower wires, corresponding to the number of pixels, is several hundred thousands to several millions. It is conceivable to form the insulating layers in multi-layer structure by the printing method, in order to prevent a pinhole from appearing in the insulating layers at the intersecting points between the wires.

In cases wherein the insulating layers are formed in the multi-layer structure, using the printing method, they are formed as a stack of multiple layers in order from the bottom layer by repeatedly carrying out steps of applying and baking the paste containing insulating particles (glass particles). There were thus cases in which a bubble sealed in an insulating layer immediately below expanded into the upper insulating layer in the baking stage for formation of the upper insulating layer. Further, there were converse cases in which a bubble appearing during the baking of the upper insulating layer was coupled with a bubble in the lower insulating layer. As a result, as illustrated in FIG. 5, there were cases in which a pinhole became continuous throughout the entire insulating layer 5 formed as a stack of multiple layers. Therefore, the formation of the insulating layers in the multi-layer structure simply by use of the printing method was not enough to restrain the occurrence of shorts between the upper and lower wires at the intersecting points in certain cases.

FIG. 5 is a sectional, schematic diagram at an intersecting point of the matrix wiring, in which the lower wire 4, insulating layer 5 of the three-layer structure, and upper wire 6 are formed in order on the substrate 9.

In order to prevent the occurrence of the above pinhole, it is thus conceivable to carry out the baking step for formation of each insulating layer at a sufficiently higher temperature than a softening point of an insulating material (insulating particles (glass particles)) for the insulating layer. It is expected that this method can melt the above insulating material (the above insulating particles (glass particles)) well to fluidize it and fill up the pinhole appearing during the application or during the baking.

However, the baking at high temperature involves the possibility of exceeding the strain point of the glass used for the substrate and inducing irreversible deformation of the glass substrate. This sometimes resulted in making it impossible to form the upper wires on the insulating layers or disabling the substrate itself utterly because of too large strain deformation of the glass substrate. There were also cases in which the insulating material (the above insulating particles (glass particles)) was melted to flow during the baking at high temperature, so as to destroy the shape of the insulating layers already having been patterned with high accuracy and in turn fail to achieve expected accuracy. Further, it is possible to use a special glass with a high strain point resistant to the baking at high temperature, for the substrate, but the use of the special glass increases the cost and lowers competitiveness of products.

Conversely, in order to avoid the use of high-cost glass, it is also conceivable to employ a method of using the insulating material (insulating particles (glass particles)) with a very low softening point for the insulating layers and baking the material at a relatively low temperature though being higher than the softening point. However, such insulating materials with very low softening points (insulating particles (glass particles)) usually include a high content of PbO or ZnO. It is thus difficult to assure the predetermined insulation resistance between the upper and lower wires, and they are often unapplicable to the insulating layers.

The present invention has been accomplished in view of the above problems and an object of the present invention is to provide a method for producing a wiring substrate, while restraining the continuous growth of the pinhole and preventing the short defect between the upper and lower wires, without using the substrate of the special material such as the high-strain-point glass or the like, in the formation of the insulating layers in the multi-layer structure by repeatedly carrying out the steps of applying (dispensing) and baking the insulating particles (glass particles). A further object of the present invention is to provide a method for producing a wiring substrate, while restraining alteration of the shape such as dullness or the like of the pattern of the insulating layers during the several baking steps. Another object of the invention is to provide a wiring substrate, an electron source, and an image-forming apparatus produced using the above production methods.

A method for producing a wiring substrate according to the present invention is a method comprising a step of forming a first wire on a substrate, a step of forming an insulating layer as a stack of M layers by repeatedly carrying out steps of laying and baking an insulating material M times (M is an integer satisfying M≧3), on the first wire, and a step of forming a second wire on the insulating layer, wherein an N-th insulating material used in formation of an insulating layer of the N-th layer (N is an integer satisfying 2≦N≦M−1) is baked at a temperature lower than a softening point of the N-th insulating material, and wherein baking temperatures in formation of respective insulating layers from the (N+1)-th layer to the M-th layer are not more than the baking temperature in the formation of the insulating layer of the N-th layer.

The production method of the present invention permits the wiring substrate to be formed at low cost, with high reliability of electric insulation between wires, and without deformation of the pattern of insulating layers.

DETAILED DESCRIPTION OF THE PREFERRED EMBODIMENTS

An example of the production method of the present invention will be explained by reference to the accompanying drawings.

FIGS. 1A to 1E are plan views for successively explaining an example of steps of producing the electron source substrate to which the production method of the present invention is suitably applicable. In FIGS. 1A to 1E only a part of the electron source substrate is illustrated in order to avoid complexity.

This example is an example in which the surface conduction electron-emitting devices are used as electron-emitting devices. However, the electron-emitting devices suitably applicable can be any two-terminal type cold-cathode devices capable of being matrix-driven; for example, the lateral field emission type electron-emitting devices (FE) are also suitably applicable.

The example described herein is an example in which each insulating layer is constructed of a stack of three layers, but the production method of the present invention may also be applied to the insulating layers as a stack of any number of layers as long as the number is not less than 3.

Figure 1A:
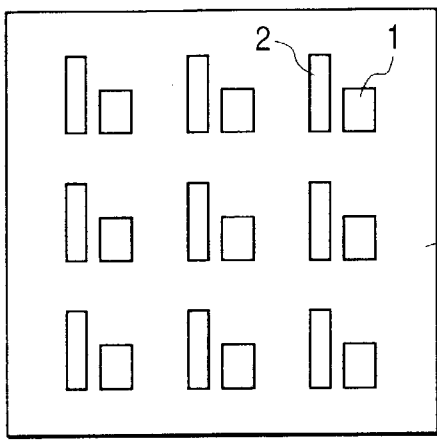
FIGS. 1A, 1B, 1C, 1D and 1E are plan views for successively explaining steps of producing an electron-emitting source substrate to show an embodiment of the present invention.

(Step 1) First, an array of many device electrodes 1, 2 are formed on the substrate 9 after cleaned well, by the photolithography process or the like (FIG. 1A).

The substrate 9 can be either one selected from glass materials such as a glass with a reduced content of impurities of Na etc., a soda lime glass, a glass substrate obtained by depositing $SiO_2$ on the soda lime glass by sputtering, CVD, or the like, and ceramic materials such as alumina or the like. Further, the present invention provides the production methods suitably applicable to the low-cost substrates, but it can also be applicable to the aforementioned high-strain-point glasses and the like, of course.

A method for the formation of the device electrodes 1, 2 can be selected from methods for forming a thin film of metal by a film-forming method of a vacuum type such as a vacuum evaporation method, a sputtering method, a plasma CVD method, or the like, thereafter patterning the film by the photolithography process or the like, and etching it, methods for applying an MO paste containing organic metal by the offset printing method and baking it, and so on.

For example, the device electrodes 1, 2 are formed with the spacing between them in the range of several $\mu$m to several hundred $\mu$m and in the thickness in the range of several hundred Å to several thousand Å. The material can be any material with an electrically conductive property, for example, one selected from metals such as Ni, Cr, Au, Mo, W, Pt, Ti, Al, Cu, Pd, or the like, and alloys thereof; printed conductors comprised of metal or metal oxide such as Pd, Ag, Au, $RuO_2$, Pd—Ag, or the like, glass, etc.; semiconductor materials such as polysilicon or the like; transparent conductors such as $In_2O_3$—$SnO_2$ etc.; and so on.

Figure 1B:
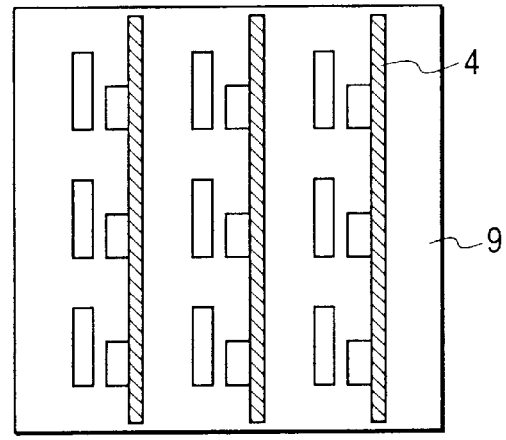

(Step 2) Next, the X-directional wires (lower wires) 4 for the matrix wiring are formed. For example, an electroconductive paste is applied in the X-direction by the screen printing method to directly form a pattern, and then the paste is baked. At this time, the X-directional wires 4 are formed so as to be connected with the device electrodes 2 in each column (FIG. 1B).

The X-directional wires 4 are preferably formed in a large thickness in order to decrease electric resistance. The conductive paste is, for example, one containing particles of silver, gold, copper, nickel, or the like, and it is preferably applied by a thick-film printing method such as the screen printing method etc. described above.

Figure 1C:
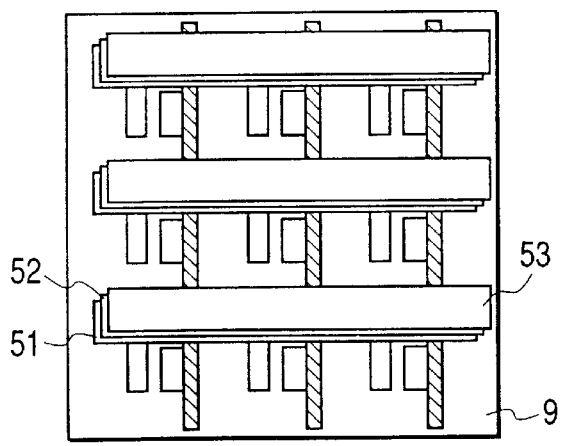

(Step 3) An insulating layer 51 of the first layer is formed in each row by applying a first insulating material along a direction (Y-direction) perpendicular to the X-directional wires 4 and baking it (FIG. 1C). The first insulating layers 51 are formed preferably by the printing method, more preferably by the thick-film printing method, and most preferably by the screen printing method.

The first insulating layers 51 as the lowermost layers of the insulating layers are formed by first preparing a paste by mixing the first insulating material (first insulating particles (glass particles)) containing lead oxide as a matrix with an appropriate polymer such as cellulose or the like, an organic solvent, and/or a vehicle, or the like as occasion may demand, and applying the paste to predetermined positions by the screen printing method or the like.

Then the baking is carried out at or above the temperature enough to couple the first insulating particles (glass particles) with each other. In order to achieve high adhesion between the first insulating layers and the substrate/wires, the first insulating layers 51 are formed preferably by baking the paste at the temperature not less than the softening point of the first insulating particles (or at the first baking temperature).

When the first insulating layers are formed using the above paste, the first baking temperature is not less than the thermal decomposition temperatures or the evaporation temperatures of the materials other than the first insulating particles, i.e., not less than the thermal decomposition temperatures or the evaporation temperatures of the polymer, the organic solvent, etc. included in the above paste.

The first insulating particles can be of a glass material in which a component or components properly selected from $B_2O_3$, ZnO, $Al_2O_3$, $SiO_2$, etc. are added to glass substance containing lead oxide as a matrix.

The first insulating particles herein are of the material of one kind, but the first insulating particles may also be comprised of particles of plural kinds having different softening points. In that case, the softening point of the first insulating particles is a temperature at which the insulating particles mixed can be coupled well with each other, which is preferably the highest softening point among those of the insulating particles mixed.

(Step 4) Next, a second insulating material is applied onto the first insulating layers 51 and is baked to form second insulating layers 52 as intermediate layers (FIG. 1C).

The second insulating layers are formed preferably by applying and baking the second insulating material (insulating particles (glass particles)) by the same method as the method used for the formation of the first insulating layers.

The material for the second insulating layers 52 (second insulating particles (glass particles)) is preferably the material used for the formation of the first insulating layers 51 (first insulating particles (glass particles)), or a material with a higher softening point than that of the first insulating layers 51.

The principal component of the second insulating particles is preferably identical with the principal component of the first insulating particles, because the first and second insulating layers can be formed with good adhesion between the first insulating layer 51 and the second insulating layer 52.

The softening point of the second insulating particles (glass particles) is set preferably to a temperature about 3 to 40° C. higher than the softening point of the first insulating particles (glass particles) or the first insulating layers 51. More preferably, the second insulating particles are compounded so as to have the softening point about 8 to 20° C. higher than the softening point of the first insulating particles. The softening point can be adjusted, for example, by properly changing a ratio of additives described previously, a mixture ratio of the materials having the different softening points, and so on.

The second insulating particles are either one of glass materials in which a component or components properly selected from $B_2O_3$, ZnO, $Al_2O_3$, $SiO_2$, etc. are added to the glass substance containing lead oxide as a matrix, similar to the first insulating particles.

The formation of the second insulating layers 52 is carried out, similar to the formation of the first insulating layers 51, by applying the second insulating particles (glass particles) onto the predetermined positions by the screen printing method or the like and thereafter baking them at a temperature (second baking temperature) lower than the softening point of the second insulating particles (glass particles). The second baking temperature is not less than the temperature enough for the second insulating particles to be coupled with each other.

In cases wherein the second insulating layers are formed by the printing method such as the screen printing method or the like, a paste is made by mixing the second insulating particles with the aforementioned organic solvent, polymer, etc. and then the paste is applied onto the predetermined positions. Therefore, the second baking temperature is at least the temperature at which the above organic solvent, polymer, etc. are thermally decomposed or evaporate, or higher.

During this baking of the second insulating layers 52 the second insulating particles (glass particles) are fused to each other to some extent, but they are not melted or fluidized completely. In other words, the insulating particles are solidified in a relatively porous state in which the insulating particles are coupled in part with each other. For this reason, even if a pinhole is formed in the first insulating layer 51 it can be prevented from expanding into the second insulating layer 52 now under the baking. This can prevent the growth of a pinhole continuous throughout a plurality of layers. Since the second baking temperature is lower than the softening point of the second insulating particles (glass particles), no dullness occurs in the pattern of the second insulating layers. On the other hand, there are cases in which the second baking temperature becomes higher than the softening point of the insulating material forming the first insulating layers 51, but the first insulating layers 51 can be restrained from softening again so as to become dull, because the first insulating layers 51 were already baked to harden and because the second insulating layers under the baking, covering the first insulating layers, absorb heat.

In this example the second insulating particles were of the material of one kind, but the second insulating particles may also be composed of particles of plural kinds having different softening points. In that case, the softening point of the second insulating particles is a temperature at which the insulating particles mixed can be coupled well with each other and is preferably the highest softening point among the softening points of the insulating particles mixed.

(Step 5) Further, a third insulating material is applied onto the second insulating layers 52 and is baked, thereby forming third insulating layers 53 as top layers (FIG. 1C).

The third insulating layers are preferably formed by applying and baking the third insulating material (third insulating particles (glass particles)) by the same method as the method used for the formation of the first and second insulating layers.

Then the third insulating material is baked at a temperature (third baking temperature) enough for the third insulating particles (glass particles) to be coupled with each other.

Particularly, where the wires are used in a high vacuum atmosphere like the electron source substrate or the like, the top insulating layers are desired to be dense films so as not to adsorb gas readily. Therefore, the third baking temperature is preferably a temperature not less than the softening point of the third insulating material but lower than the softening point of the second insulating particles (glass particles) or the second insulating layers 52.

Further, the third baking temperature is preferably not more than the softening point of the first insulating layers 51 from the viewpoint of retaining the shape of the insulating layers.

When the third insulating layers are formed by the printing method such as the screen printing method or the like, a paste is first made by mixing the third insulating particles with the aforementioned organic solvent, polymer, etc. and is then applied to the predetermined positions. When the third insulating layers are formed using the above paste, the third baking temperature is at least the temperature at which the above organic solvent, polymer, etc. are thermally decomposed or sublimate, or higher.

The principal component of the third insulating particles is preferably the same as that of the second insulating particles, because they can be formed with good adhesion between the third insulating layer 53 and the second insulating layer 52. The third insulating particles can be of one selected from the glass materials in which a component or components properly selected from $B_2O_3$, ZnO, $Al_2O_3$, $SiO_2$, etc. are added to the glass substance containing lead oxide as a matrix, similar to the first and second insulating particles.

In this example the third insulating particles are of the material of one kind, but the third insulating particles may be composed of particles of plural kinds having different softening points. In that case, the softening point of the third insulating particles is a temperature at which the insulating particles mixed can be coupled well with each other and is preferably the highest softening point among the softening points of the insulating particles mixed.

During the baking of the third insulating layers 53 the third insulating particles are softened, but the second insulating layers 52 are not softened basically. Since the baking temperature is one suitable for the top layers 53, the insulating layer pattern can be restrained from becoming dull.

Figure 1D:
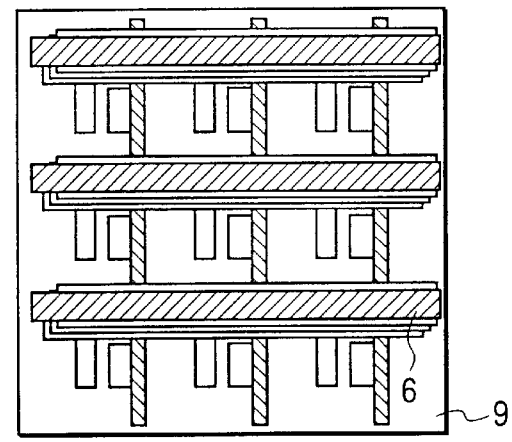
Figure 1E:
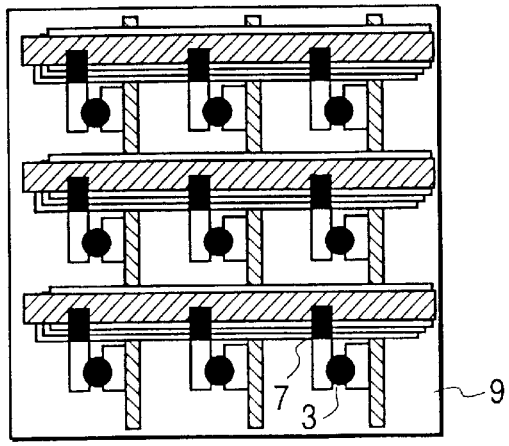
Figure 1E:
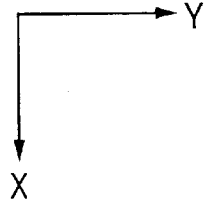
Figure 7A:
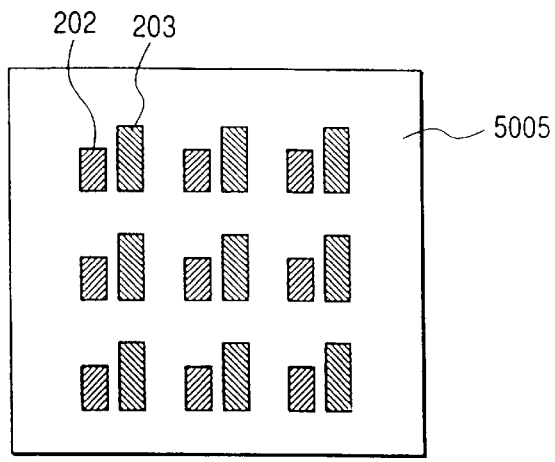
FIGS. 7A, 7B, 7C, 7D, 7E and 7F are schematic diagrams to show a process of producing an electron source substrate using surface conduction electron-emitting devices.
Figure 7B:
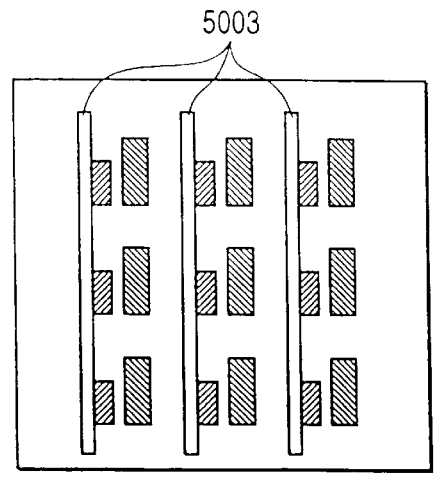
Figure 7B:
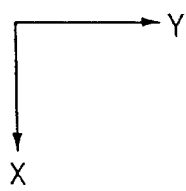
Figure 7C:
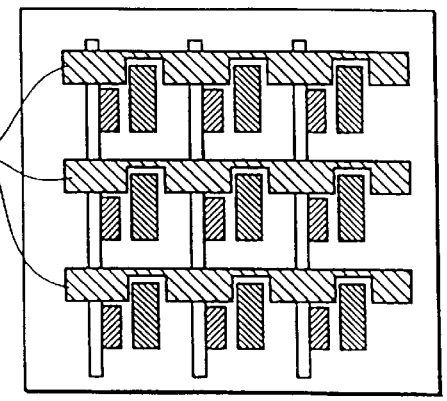
Figure 9:
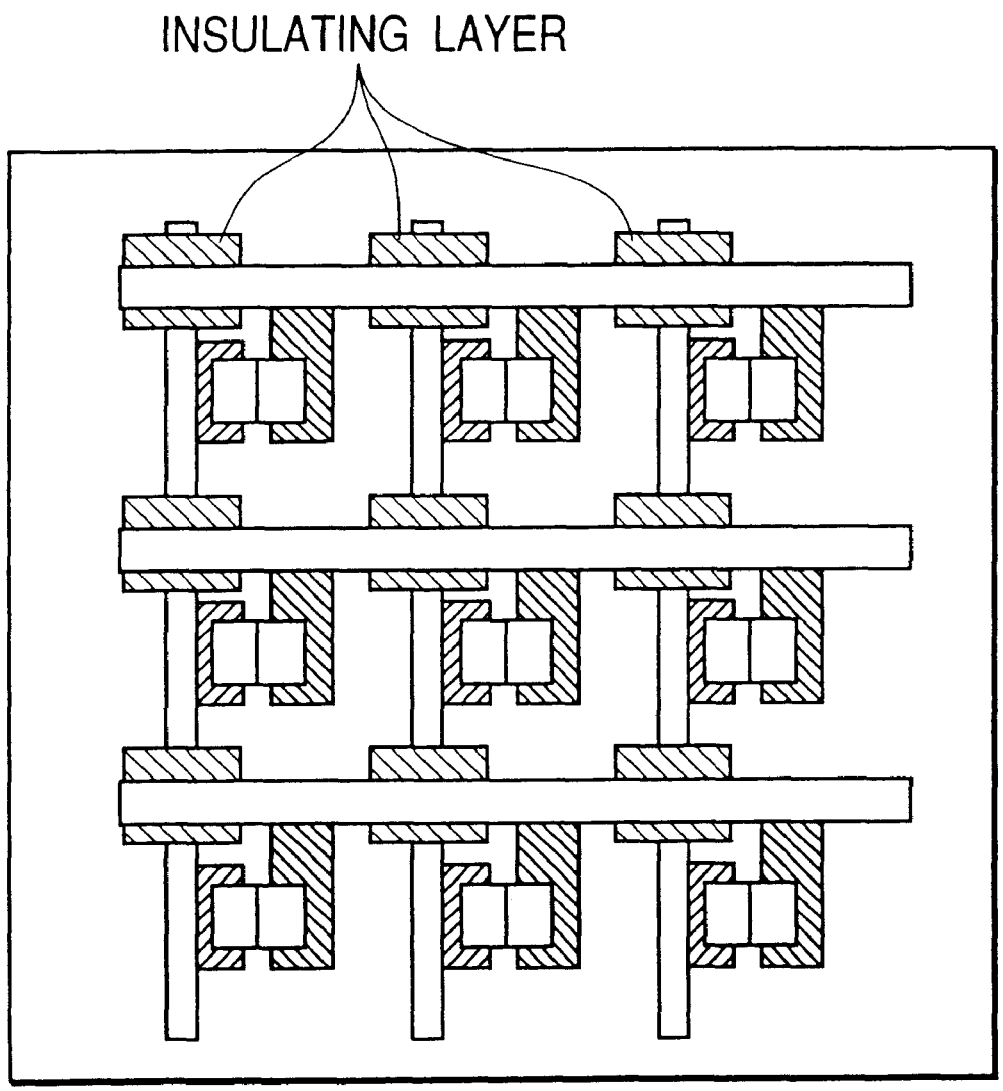
FIG. 9 is a schematic diagram to show another form of the electron source substrate to which the present invention is suitably applicable.
Figure 9:
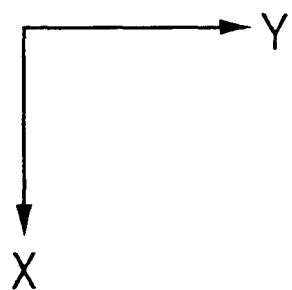

Since a necessary condition for the insulating layers (51, 52, 53) is just at least to be able to electrically insulate the intersections between the Y-directional wires 4 and the X-directional wires 6, they do not have to be limited to the beltlike shape illustrated in FIG. 1C. For example, they can also be formed in the shape in which the insulating layers are scattered only at the intersecting points as illustrated in FIG. 9, in the comb teeth shape as illustrated in FIG. 7C, or the like. FIGS. 1C to 1E show the insulating layers (51, 52, 53) in a shifted state for easier understanding, but the present invention is not limited to the formation of the insulating layers (51, 52, 53) in the shifted state. In practice, it is preferable to form an upper insulating layer on a lower insulating layer without a shift (without projection) in terms of the definition.

The total thickness of the insulating layers (51, 52, 53) formed in the stack structure is, for example, 10 to 100 $\mu$m and preferably 20 to 50 $\mu$m.

Further, the present invention is not limited to the structure in which the third insulating layers 53 are the top layers, but can also be applied to structures in which more layers are stacked.

For example, in the case of a stack of M layers (M is an integer not less than 3), the baking temperature of the N-th insulating layer (N is an integer not less than 2 and not more than M−1), which is located between the first insulating layer of the lowermost layer and the M-th insulating layer of the uppermost layer, is set to a temperature lower than the softening point of the N-th insulating particles and the baking temperature for formation of each of the (N+1)th to the M-th insulating layers is set to a temperature not more than the baking temperature for formation of the N-th insulating layer. It is noted here that the baking temperature of each of the layers is set to a temperature enough to couple the insulating particles (glass particles) of each layer with each other.

Further, where the wires are used in a high vacuum atmosphere like the electron source substrate or the like, the M-th insulating layer of the top layer is desired to be a dense film so as not to adsorb gas readily. Therefore, the M-th baking temperature is preferably at least the softening point of the M-th insulating particles (glass particles) for formation of the M-th insulating layer, or higher.

Further, in order to form the dense insulating layers, it is preferable that the softening point of the N-th insulating particles be higher than those of the (N+1)th to the M-th insulating particles and that the baking temperature of each of the (N+1)th to the M-th insulating particles be not less than the softening point of each corresponding layer.

In addition to the above, it is also preferable in order to restrain the deformation of the shape of the insulating layers that the softening points of the N-th to the M-th insulating particles be selected so as to decrease in order from the N-th insulating particles to the M-th insulating particles and that the baking temperature of each layer be set so as to be always lower than the softening point of the lower insulating layer.

Further, it is preferable that the baking temperature of the first layer be higher than the softening point of the first insulating particles, in terms of the adhesion to the substrate or to the lower wires.

It is also preferable that the softening point of each of the first to the (N−1)th insulating layers or insulating particles be not less than the N-th baking temperature, in order to restrain the deformation of the shape of the insulating layers.

On the other hand, from the viewpoint of the production at low cost, it is preferable that the softening point of each of the first to the (N−1)th insulating layers or insulating particles be not more than the N-th baking temperature and that the baking temperature of each layer be not more than the N-th baking temperature.

For this reason, it is preferable that the softening point of each of the first to the (N−1)th insulating layers or insulating particles be set substantially to the same as the N-th baking temperature and that the baking temperatures of the first to the N-th layers be substantially identical.

When the first to the M-th insulating layers are formed by the printing method such as the screen printing method or the like, a paste is first prepared by mixing the first to the M-th insulating particles with the aforementioned organic solvent, polymer, etc. and then is applied to the predetermined positions. Therefore, the baking temperatures of the first to the M-th layers are set to be at least the temperature at which the above organic solvent, polymer, etc. are thermally decomposed or the temperature at which they sublimate, or higher.

(Step 6) After this, the Y-directional wires 6 for the matrix wiring are formed on the third insulating layers 53 (FIG. 1D). So, the Y-directional wires 6 are substantially perpendicular to the X-directional wires 4. For example, similar to the X-directional wires 4 described above, an electroconductive paste is applied onto the third insulating layers 53 by the screen printing method to form a pattern directly, and is then baked, the baking temperature is lower than the softening point of second insulating particles (second insulating layer). At this time, connecting wires 7 for connection to the device electrodes 2 are also formed in an attached state to the Y-directional wires 6 (FIG. 1E).

The Y-directional wires 6 are preferably formed in a large thickness in order to reduce the electric resistance. The electroconductive paste is, for example, one containing particles of silver, gold, copper, nickel, or the like and is preferably applied by the thick-film printing method such as the aforementioned screen printing method or the like.

Figure 7D:
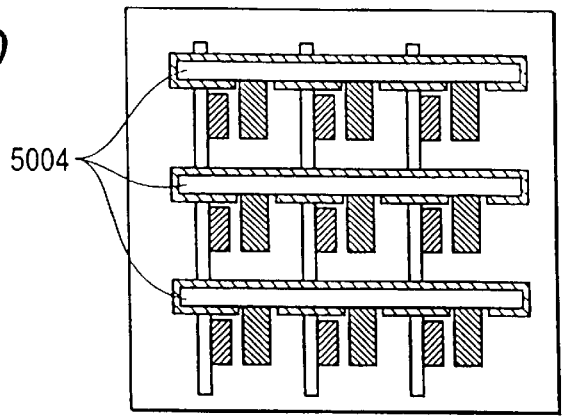
Figure 7E:
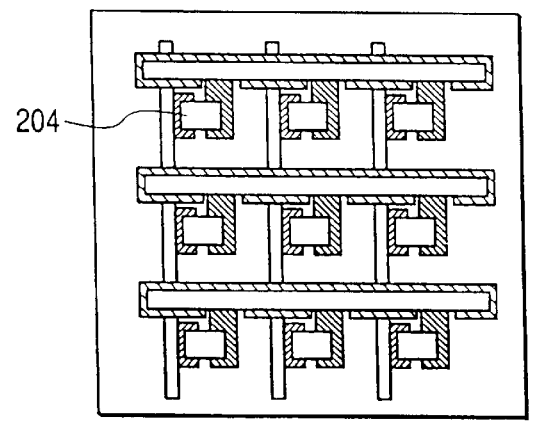
Figure 7F:
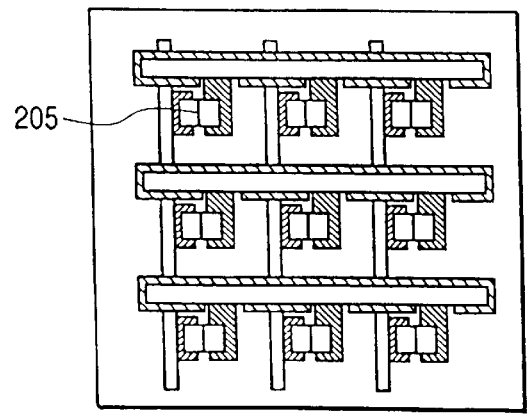

Described above was the example using the Y-directional wires 6 and connecting wires 7. However, where the comb teeth shape illustrated in FIG. 7C is applied to the shape of the insulating layers (51, 52, 53), the electrodes 2 can be connected to the Y-directional wires without formation of the connecting wires 7 by simply forming the Y-directional wires 6 in the line pattern as illustrated in FIG. 7D, which is thus preferable.

(Step 7) Next, electrically conductive, thin films 3 are formed so as to connect the device electrode 1 to the device electrode 2 (FIG. 1E). They are formed by the photolithography process, the ink-jet process, or the like.

A material for the conductive, thin films 3 can be selected from metals such as Pt, Ru, Ag, Au, Ti, In, Cu, Cr, Fe, Zn, Sn, Ta, W, Pb, and the like, oxides such as PdO, $SnO_2$, $In_2O_3$, PbO, $Sb_2O_3$, and the like, borides such as $HfB_2$, $ZrB_2$, $LaB_6$, $CeB_6$, $YB_4$, $GdB_4$, and the like, carbides such as TiC, ZrC, HfC, TaC, SiC, WC, and the like, nitrides such as TiN, ZrN, HfN, and the like, semiconductors such as Si, Ge, and the like, carbon, AgMg, NiCu, Pb, Sn, and so on.

The ink-jet method can be a method in which a heating resistance element is buried in a nozzle and in which it is heated to boil a liquid to eject a droplet by pressure of a bubble in the liquid (bubble jet (BJ) method), or a method in which an electric signal is applied to a piezo device to deform the device and induce change of the volume of a liquid chamber, thereby ejecting a droplet (piezo jet (PJ) method), or the like.

The ink jet method can discharge a liquid containing the material for forming the above conductive films and deliver a desired size of the liquid at a desired position for formation of each conductive film.

Figure 8A:
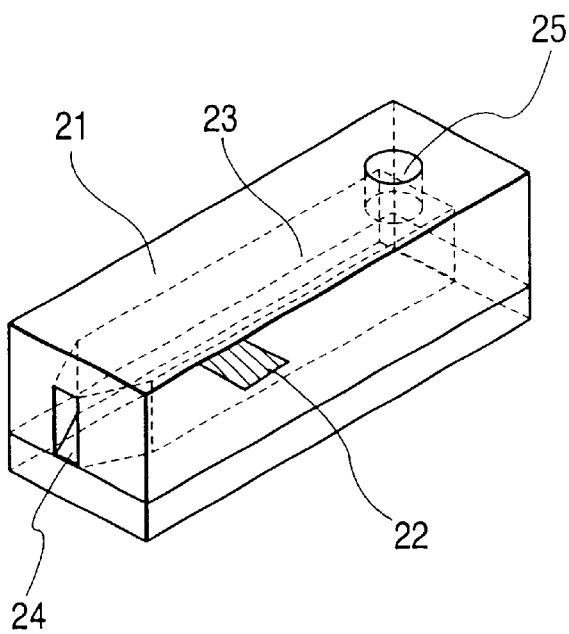
FIGS. 8A and 8B are schematic diagrams to show ink-jet devices suitably applicable to the present invention.
Figure 8B:
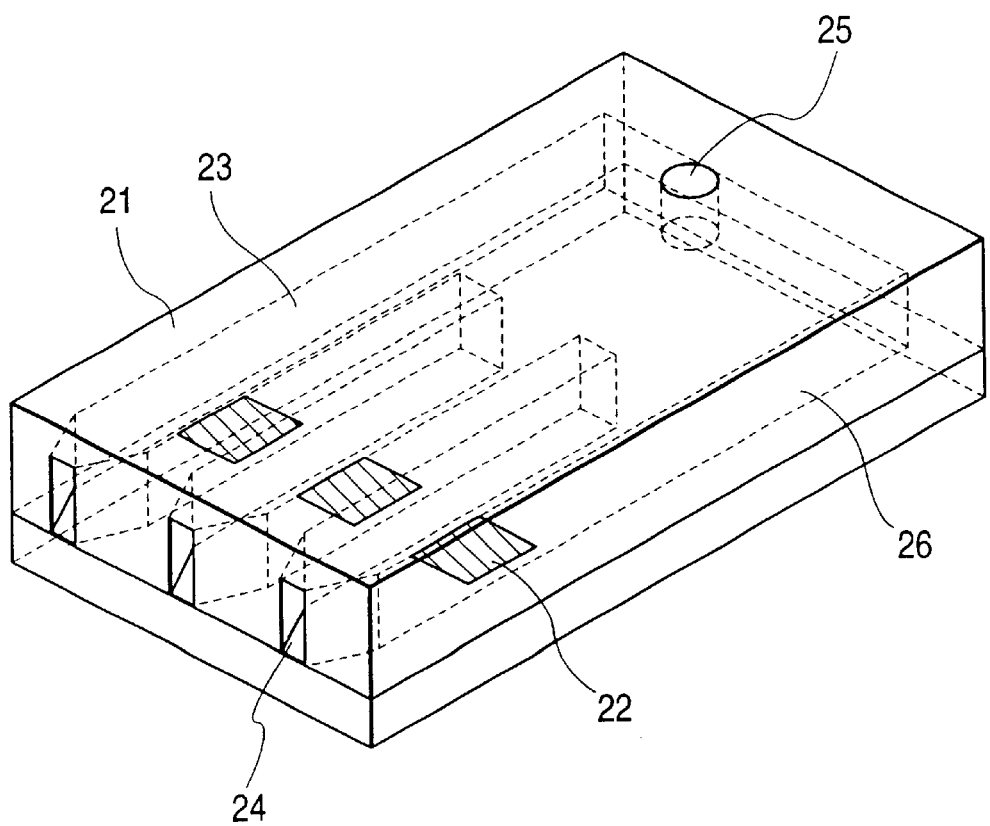

FIG. 8A and FIG. 8B are schematic diagrams of ink jet heads (discharging devices) used in the ink jet method. FIG. 8A shows a single nozzle head 21 having a single eject port (nozzle) 24. FIG. 8B shows a multi-nozzle head 21 having a plurality of droplet eject ports (nozzles) 24. Particularly, the multi-nozzle head is effective in production of a display in which a plurality of devices need to be formed on the substrate, because it can shorten the time necessary for the delivery of the liquid. In FIGS. 8A and 8B, numeral 22 designates heaters or piezo devices, 23 ink (the above liquid) paths, 25 ink (the above liquid) supply portions, and 26 ink (the above liquid) reservoir. A tank of the ink (the above liquid) is provided apart from the head 21 and the tank is connected to the head 21 at the ink supply portion 25 through a tube.

Liquids that can be used in the ink jet method are, for example, liquids in which particles of either of the aforementioned materials are dispersed, liquids containing compounds such as complexes of the aforementioned materials or the like, and so on, but are not limited to these.

(Step 8) Then the substrate 9 through the above steps up to step 7 is placed in a chamber under a controlled atmosphere and electric current is allowed to flow to each conductive thin film 3 through the X-directional and Y-directional wires, thereby forming the electron-emitting region in each conductive film 3.

The electron source substrate is completed through the above steps.

In one embodiment of the production method of the present invention described above, the insulating layers are formed in the structure of at least three layers by repeatedly carrying out the application and baking of the insulating particles (glass particles). The softening point of the second insulating particles (glass particles) used for formation of the intermediate layers (second insulating layers 52) is higher than those of the first and third insulating particles (glass particles) used for formation of the lowermost layers (first insulating layers 51) and the uppermost layers (third insulating layers 53). Further, the baking temperature (second baking temperature) for formation of the second insulating layers is the temperature lower than the softening point of the second insulating particles.

Therefore, during the second baking the second insulating particles are fused to some extent but are not fluidized. Therefore, even if a pinhole is formed in the first insulating layer 51 it will not become continuous into the second insulating layer 52 currently under baking. Therefore, a pinhole is prevented from growing in communication throughout a plurality of insulating layers.

The present invention can prevent the continuous growth of the pinhole without use of the substrate of the special material such as the high-strain-point glass or the like in the formation of the insulating layers in the multi-layer structure. As a result, the invention can prevent the occurrence of short defect between the upper and lower wiring layers.

Further, the second baking temperature is the low temperature for the second insulating layers 52 (second insulating particles), so that the insulating layer pattern can be prevented from becoming dull. There are cases in which the second baking temperature is a high temperature for the first insulating layers 51, but the first insulating layers 51 are already baked to harden and the second insulating layers under baking, covering them, absorb heat, thereby restraining the first insulting layers from again becoming softened and dull. Namely, the insulating layers can be protected from the damage such as the dullness of the insulating layer pattern or the like during the baking. As a result, there occurs no failure in the wiring connections and the yield in production can be increased.

The present invention will be described in further detail as to the method for producing the insulating layers according to the present invention and as to the electron source and image-forming apparatus produced using the method.

EXAMPLES 1 to 5

Comparative Example 1

In each of the examples and comparative example, an electron source substrate with surface conduction electron-emitting devices was produced according to the process described referring to FIGS. 1A to 1E.

The insulating pastes of five types of A to E as listed in Table 1 below were used for the formation of the insulating layers. The insulating particles (glass particles) in each insulating paste of A to E were those having the softening point in the range of 550 to 480° C., as shown in Table 1 below.

TABLE 1

| | Softening temperature (° C.) |
|---|---|
| insulating paste A | 550 |
| insulating paste B | 530 |
| insulating paste C | 515 |
| insulating paste D | 490 |
| insulating paste E | 480 |

Figure 2:
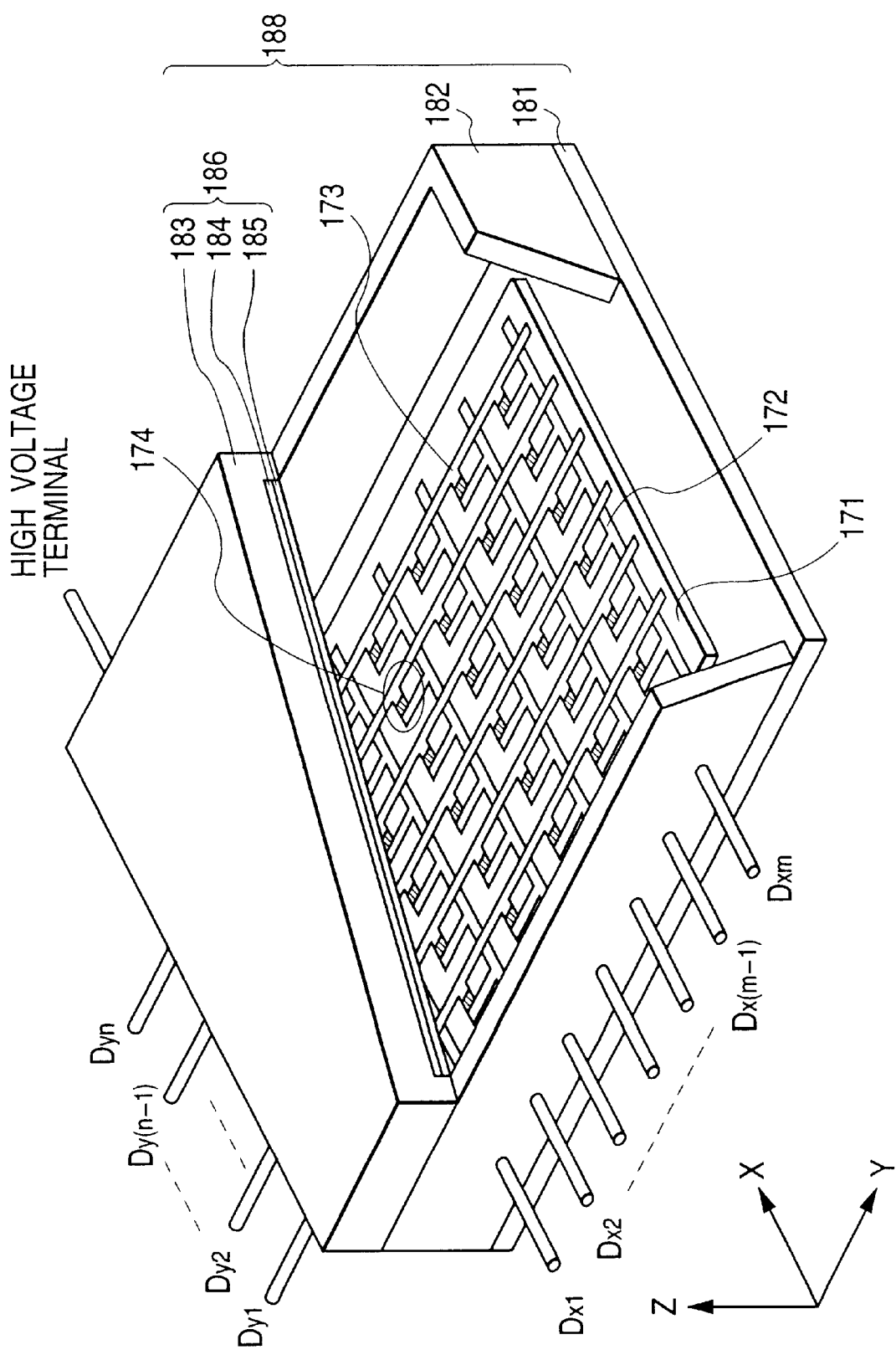
FIG. 2 is a perspective view of an image-forming apparatus, partly broken, to show Example 6 of the present invention.

In Examples 1 to 5 and Comparative Example 1, the insulating layers were formed in the multi-layer structure by printing using the pastes selected from the insulating pastes A to E listed in Table 1 above. Table 2 below shows the insulating pastes used for the respective layers, the baking temperatures of the respective layers, and the number of shorts between the upper and lower wires, detailed below, in each of the examples.

electron source substrate made in Example 2. FIG. 2 is a perspective view of the image-forming apparatus, partly broken.

TABLE 2

|  | 1st layer | baking temp | 2nd layer | baking temp | 3rd layer | baking temp | 4th layer | baking temp | No. of short |
|---|---|---|---|---|---|---|---|---|---|
| Ex 1 | E | 480 | D | 480 | E | 480 | — | — | 0 |
| Ex 2 | D | 510 | C | 510 | D | 510 | — | — | 0 |
| Ex 3 | E | 480 | A | 480 | E | 480 | — | — | 1 |
| Ex 4 | E | 480 | C | 510 | E | 480 | — | — | 2 |
| Ex 5 | B | 540 | A | 540 | B | 540 | B | 540 | 0 |
| Comp Ex 1 | C | 520 | C | 520 | C | 520 | — | — | 15 |

According to the steps in the embodiment described above referring to FIGS. 1A to 1E, the device electrodes were formed by the photolithography process and then the X-directional wires, the first, second, and third insulating layers (and the fourth interlayer insulating layer in Example 5), and the Y-directional wires were printed by the screen printing method and baked in order. The baking temperature of each insulating layer was adjusted so that the temperature indicated in Table 2 was a peak and retained for about ten minutes and thereafter the temperature was decreased gradually.

The device electrodes 1, 2 were formed by depositing a thin film of metal on the soda lime glass substrate 9 cleaned well, by the sputtering method and thereafter patterning the thin film by the photolithography process. The material of the device electrodes was the thin film of Pt 60 nm thick with an undercoat layer of Ti and the gap between the device electrodes was 10 μm.

The conductive films 3 were formed by delivering an organic palladium complex so as to connect the electrodes to each other, using the ink-jet device of the bubble jet method illustrated in FIG. 8B, and baking it.

The Y-directional wires 6 and X-directional wires 4 forming the matrix wiring were formed as follows; a conductive paste was made by adding fine powder of Ag 65 wt % and low-temperature frit glass (the softening point of about 340° C.) about 3 wt % to the vehicle about 30 wt % in which cellulose 5 wt % was added to α-terpineol, and by mixing and agitating them in a roller mill, the paste was applied to the predetermined positions by the screen printing method, and then it was baked at about 400° C. In each example and the comparative example, the number of Y-directional wires 6 was 300 and the number of X-directional wires 4 was 500.

With the electron source substrates of the examples and the comparative example formed as described above, the number of shorts was counted at the intersecting points between the wires.

As indicated in Table 2, in the case of the electron source substrate of Comparative Example 1, where all the three insulating layers were made of the same material and baked at the same temperature, there appeared many shorts due to pinholes.

In the case of Examples 1 to 5, where the intermediate insulating layer (second layer) was made of the insulating paste having the high softening point, there appeared no short due to a pinhole or the number of shorts was decreased apparently.

EXAMPLE 6

Example 6 is an example in which the image-forming apparatus illustrated in FIG. 2 was produced using the electron source substrate made in Example 2. FIG. 2 is a perspective view of the image-forming apparatus, partly broken.

For forming the image-forming apparatus of the present example, the electron source substrate 171 prepared in Example 2 was first fixed onto a rear plate 181 with frit glass. The electron source substrate fixed in this stage was the one in the stage of FIG. 1E, in which the electron-emitting region was not formed yet in each conductive film 3.

After this, a support frame 182 and a face plate 186 were set on the rear plate 181, with their joints coated with the frit glass, and they were heated at 400° C. in the atmosphere for ten or more minutes to be sealed. In the color case, correct correspondence must be made between each color fluorescent material and the electron-emitting device on the occasion of this sealing, and thus adequate alignment was made.

The face plate 186 was one in which fluorescent film 184 and metal back 185 were provided on an internal surface of glass substrate 183 and which was prepared in another step.

The rear plate 181 and face plate 186 were spaced at a predetermined distance opposite to each other and in this example the face plate 186 was located 5 mm above the electron source substrate 171.

In the monochrome case, the fluorescent film 184 is made of only a fluorescent material. The present embodiment adopted the stripe pattern of fluorescent materials, which was made by first forming black stripes and then applying the fluorescent materials of the respective colors onto gaps between the black stripes. The material of the black stripes was a material containing graphite as a matrix. The fluorescent materials were applied onto the glass substrate 183 by the slurry process. The surface of the fluorescent film 184 was subjected to a smoothing treatment called "filming." Then Al was deposited on the surface of the fluorescent film 184 by vacuum evaporation, thereby forming the metal back 185.

For enhancing the electroconductive property of the fluorescent film 184, the face plate 186 was provided with a transparent electrode (not illustrated) on the outside of the fluorescent film 184.

Then the sealed glass vessel or envelope 188 was evacuated through an unrepresented exhaust pipe to exhaust the internal atmosphere to a predetermined vacuum degree by a vacuum pump. In that state a control unit not illustrated was connected to driving terminals Dx1 to Dxm, Dy1 to Dyn outside the vessel and a voltage was placed between the device electrodes 1, 2 of the electron-emitting devices 174 to cause flow of electric current in each conductive film 3, thereby forming the electron-emitting regions (forming operation and activation operation were carried out).

After that, the inside of the vessel was evacuated down to the vacuum of about $1.3 \times 10^{-5}$ Pa and the exhaust pipe not illustrated was heated by a gas burner to seal the exhaust pipe, thereby effecting sealing of the envelope 188. Finally, getter operation was carried out by a high-frequency heating method in order to maintain the vacuum degree after the sealing.

With the image display device thus completed through the above steps, signal generating means were connected to the driving terminals Dx1 to Dxm, Dy1 to Dyn outside the vessel and properly applied scanning and modulation signals to each electron-emitting device 174 to induce emission of electrons. Further, the high voltage of 5 kV or higher was applied via a high-voltage terminal Hv to the metal back 184 or to the transparent electrode (not illustrated), whereby electron beams were accelerated and made to collide with the fluorescent film 184 to bring about excitation and luminescence, thereby displaying an image. As a result, the display was achieved with high quality but with little irregularity of luminance. It was also verified that reactive current was very little during the display of image and that the driving power was also low.

EXAMPLE 7

Figure 10A:
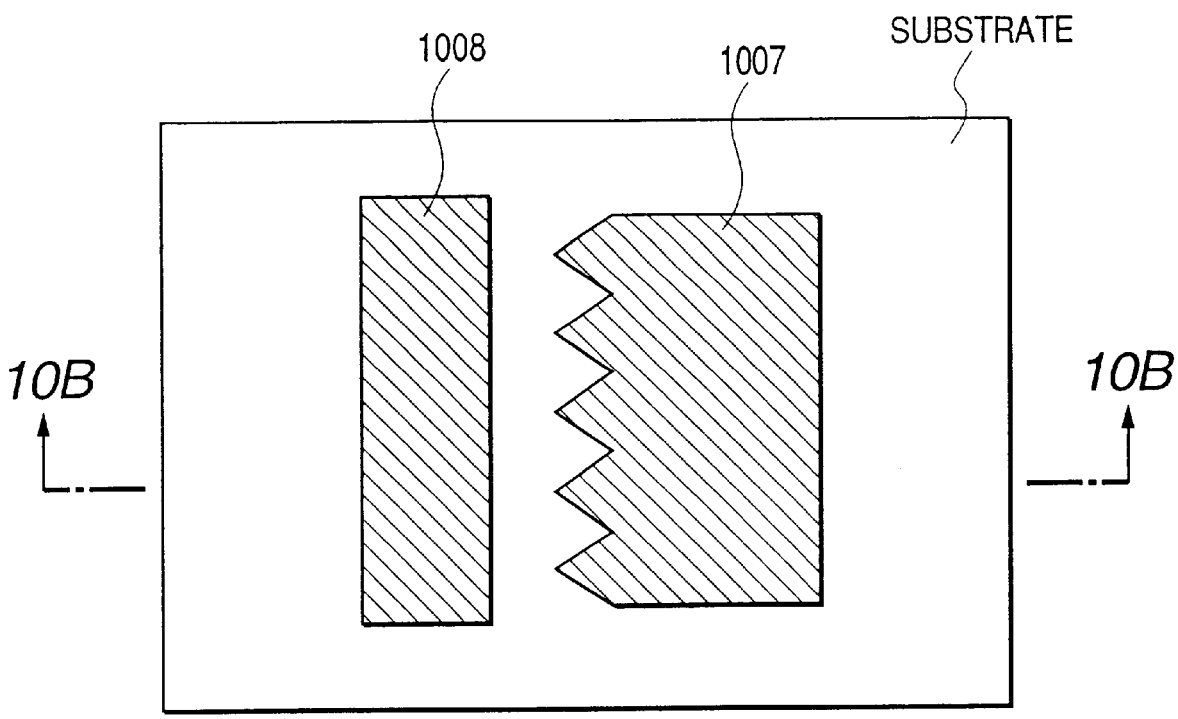
FIGS. 10A and 10B are a schematic plan view and a schematic sectional view of a lateral field emission type electron-emitting device to which the present invention is suitably applicable.
Figure 10B:
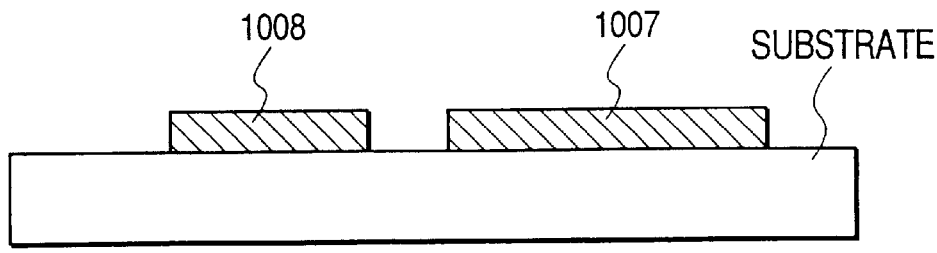

In the present example the image-forming apparatus illustrated in FIG. 2 was also produced in a similar manner to that in Example 6. In the present example the electron-emitting devices, however, were the lateral field emission type electron-emitting devices illustrated in FIGS. 10A and 10B. FIG. 10A is a schematic plan view of one device and FIG. 10B is a schematic sectional view thereof along a line A-B in FIG. 10A.

A method for producing the electron source substrate of the present example will be described below referring to FIGS. 11A to 11D.

Figure 11A:
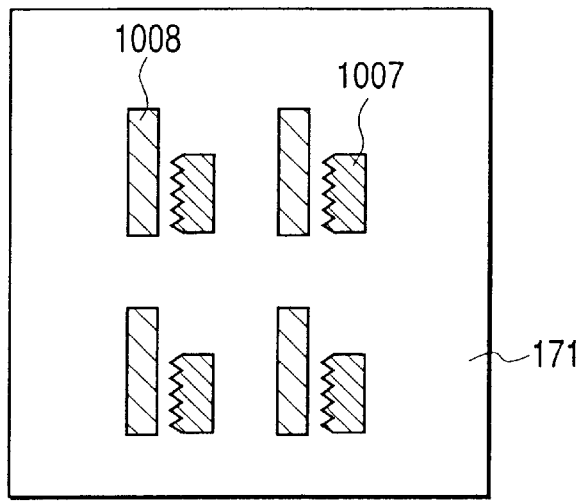
FIGS. 11A, 11B, 11C and 11D are schematic diagrams to show a process of producing an electron source substrate using lateral field emission type electron-emitting devices to which the present invention is suitably applicable.

(Step 1) First, pairs of gate electrode 1008 and emitter electrode 1007 were formed in a matrix of 1000 sets in the Y-direction and 700 sets in the X-direction on the substrate 171 of soda lime glass cleaned well, by the photolithography process (FIG. 11A).

Figure 11B:
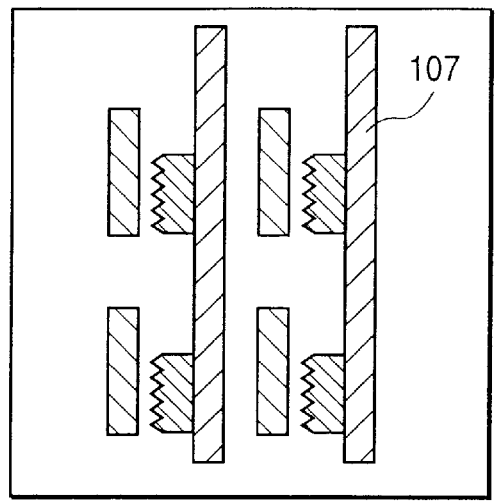

(Step 2) X-directional wires 107 were made in 1000 column lines, each wire being a common wire connecting the gate electrodes in each column (FIG. 11B). The X-directional wires 4 were made by applying a silver paste by the screen printing method, drying it, and thereafter baking it under the conditions of the temperature of 480° C. and the peak retention time of five minutes. The X-directional wires 4 had the width of 100 μm and the thickness of 10 μm.

(Step 3) Then the aforementioned insulating paste E was applied so as to be perpendicular to the X-directional wires and then was baked under the conditions of the temperature of 480° C. and the peak retention time of ten minutes, thereby forming 700 lines of the first insulating layers in the comb teeth shape.

The second insulating layer was made in an identical pattern on each of all the first insulating layers. The second insulating layers were made by applying the aforementioned insulating paste A by use of the screen plate used for the formation of the first insulating layers and baking the paste under the conditions of the temperature of 520° C. and the peak retention time of ten minutes.

Further, the third insulating layer was formed in an identical pattern on each of all the second insulating layers. The third insulating layers were made by applying the aforementioned insulating paste E by use of the screen plate used for the formation of the first insulating layers and baking the paste under the conditions of the temperature of 480° C. and the peak retention time of ten minutes.

Figure 11C:
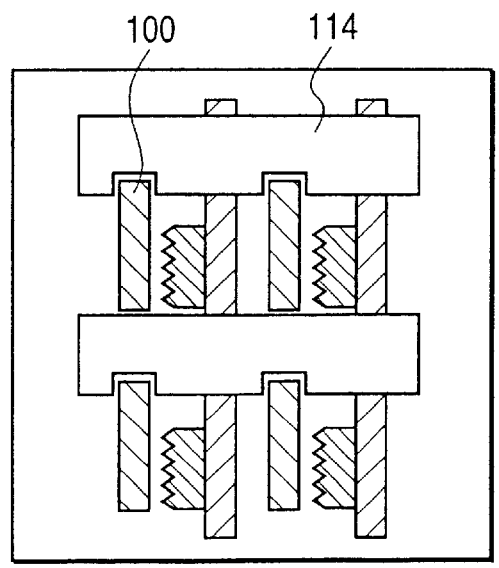

Through the above steps, the insulating layers 114 were made each in the structure comprised of the three layers and having openings corresponding to the gate electrodes (FIG. 11C).

Figure 11D:
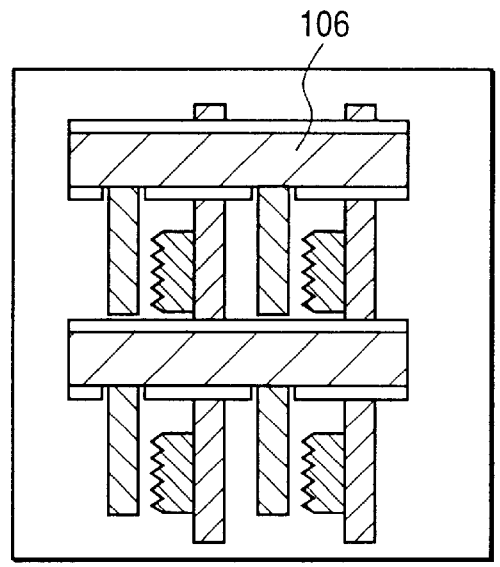

(Step 4) The Y-directional wires 106 were formed in 700 row lines on the respective insulating layers 114, each wire being a common wire connecting a plurality of gate electrodes 1008 in each row (FIG. 11D). The Y-directional wires 106 were made in a similar manner to the X-directional wires 107 by applying the aforementioned silver paste by the screen printing method, drying it, and thereafter baking it under the conditions of the temperature of 430° C. and the peak retention time of ten minutes. The Y-directional wires 106 were printed wires having the width of 300 μm and the thickness of 20 μm.

The electron source substrate completed through the above steps was inspected. As a result, it was confirmed that there was no short between the Y-directional wires 106 and the X-directional wires 107. The characteristics of the electron-emitting devices were also checked and it was verified that there was no anomaly.

After this, the above electron source substrate, support frame 182, and face plate 186 were set on the rear plate 181, with their joints coated with the frit glass, and they were heated at 400° C. in a vacuum for ten or more minutes, thereby forming the envelope 188 maintained in a high vacuum inside (FIG. 2). In the color case, correct correspondence must be made between the fluorescent materials of the respective colors and the electron-emitting devices on the occasion of this sealing, and thus adequate alignment was made.

The face plate 186 was one in which the fluorescent film 184 and metal back 185 were provided on the internal surface of glass substrate 183 and which was prepared in another step.

The rear plate 181 and face plate 186 were spaced at a predetermined distance opposite to each other and in this example the face plate 186 was located 5 mm above the electron source substrate 171.

In the monochrome case, the fluorescent film 184 is made of only a fluorescent material. The present embodiment adopted the stripe pattern of fluorescent materials, which was made by first forming black stripes and then applying the fluorescent materials of the respective colors onto gaps between the black stripes. The material of the black stripes was the material containing graphite as a matrix. The fluorescent materials were applied onto the glass substrate 183 by the slurry process. The surface of the fluorescent film 184 was subjected to the smoothing treatment called "filming." Then Al was deposited on the surface of the fluorescent film 184 by vacuum evaporation, thereby forming the metal back 185.

For enhancing the electroconductive property of the fluorescent film 184, the face plate 186 was provided with the transparent electrode (not illustrated) on the outside of the fluorescent film 184.

Finally, the getter operation was then carried out by the high-frequency heating method in order to maintain the vacuum degree after the sealing.

With the image display device thus completed through the above steps, the signal generating means were connected to the driving terminals Dx1 to Dxm, Dy1 to Dyn outside the vessel and properly applied scanning and modulation signals to each electron-emitting device 174 to induce emission of electrons. Further, the high voltage of 5 kV or higher was applied via the high-voltage terminal Hv to the metal back 184 or to the transparent electrode (not illustrated), whereby electron beams were accelerated and made to collide with the fluorescent film 184 to bring about excitation and luminescence, thereby displaying an image. As a result, the display was achieved with high quality but with little irregularity of luminance. It was also verified that reactive current was very little during the display of image and that the driving power was also low.

EXAMPLE 8

Figure 3A:
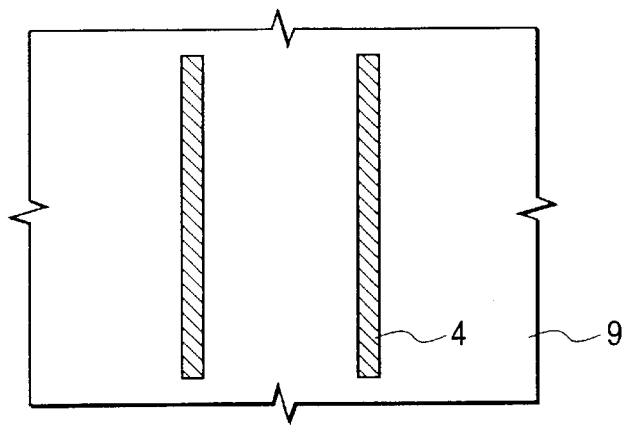
FIGS. 3A, 3B and 3C are plan views for successively explaining steps of producing a wiring substrate to show Example 7 of the present invention.
Figure 3B:
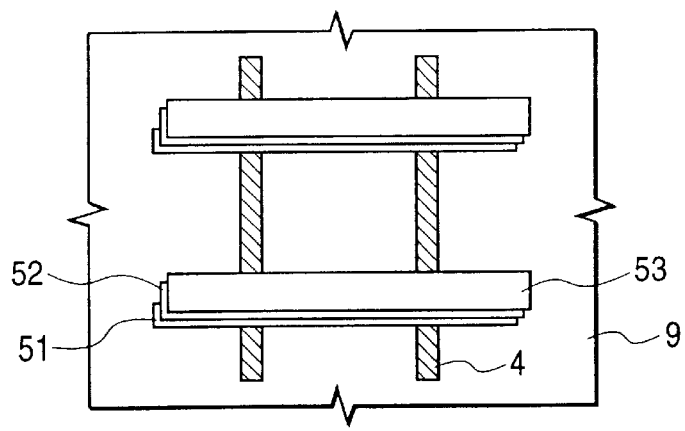
Figure 3C:
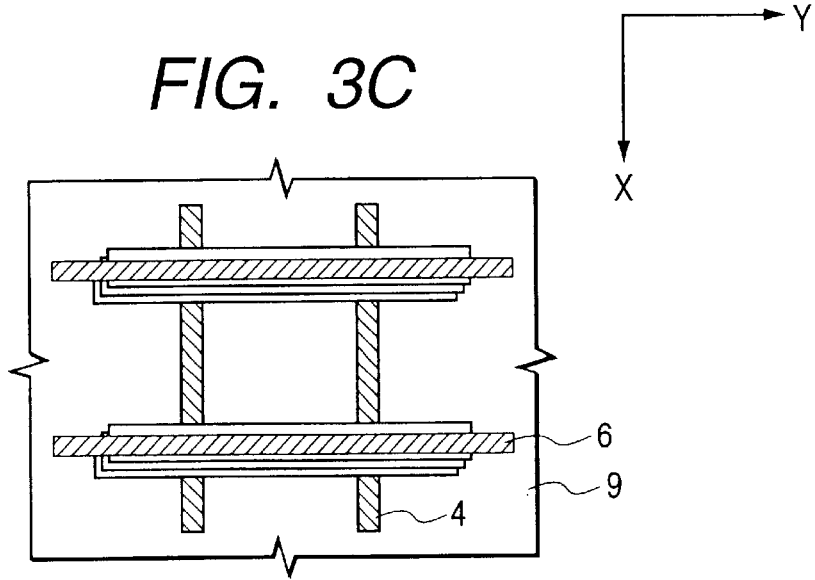
Figure 4A:
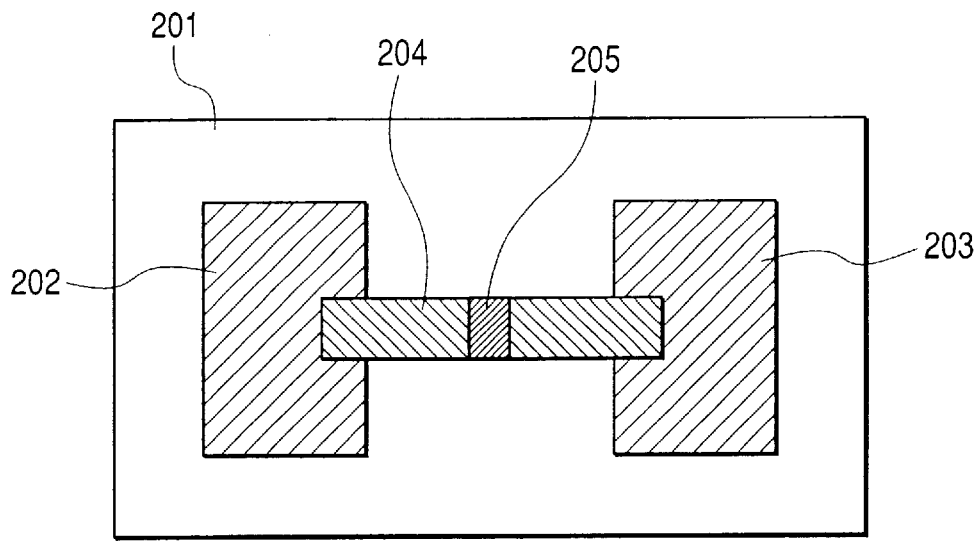
FIGS. 4A and 4B are a plan view and a sectional view of the structure of a device to show an example of the surface conduction electron-emitting device.
Figure 4B:
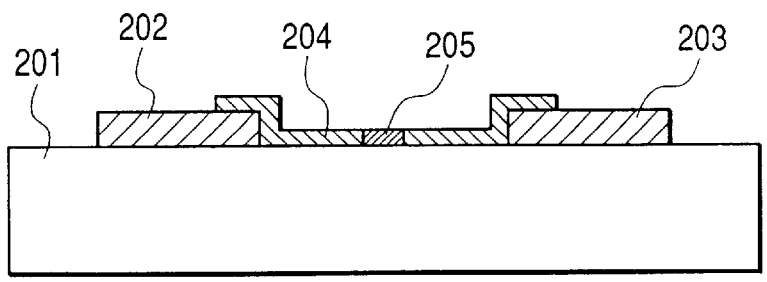
Figure 5:
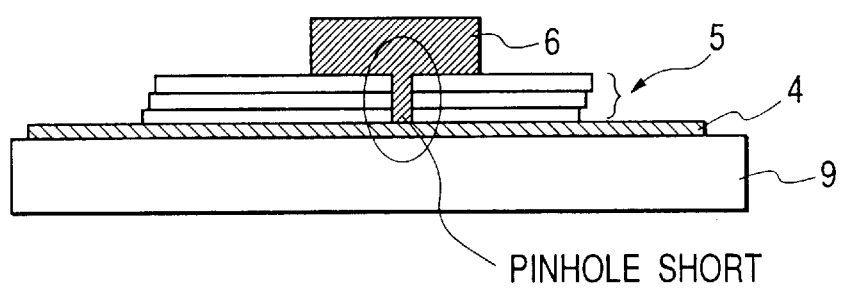
FIG. 5 is a sectional view of a circuit substrate for explaining a pinhole short in the interlayer insulating layer.
Figure 6:
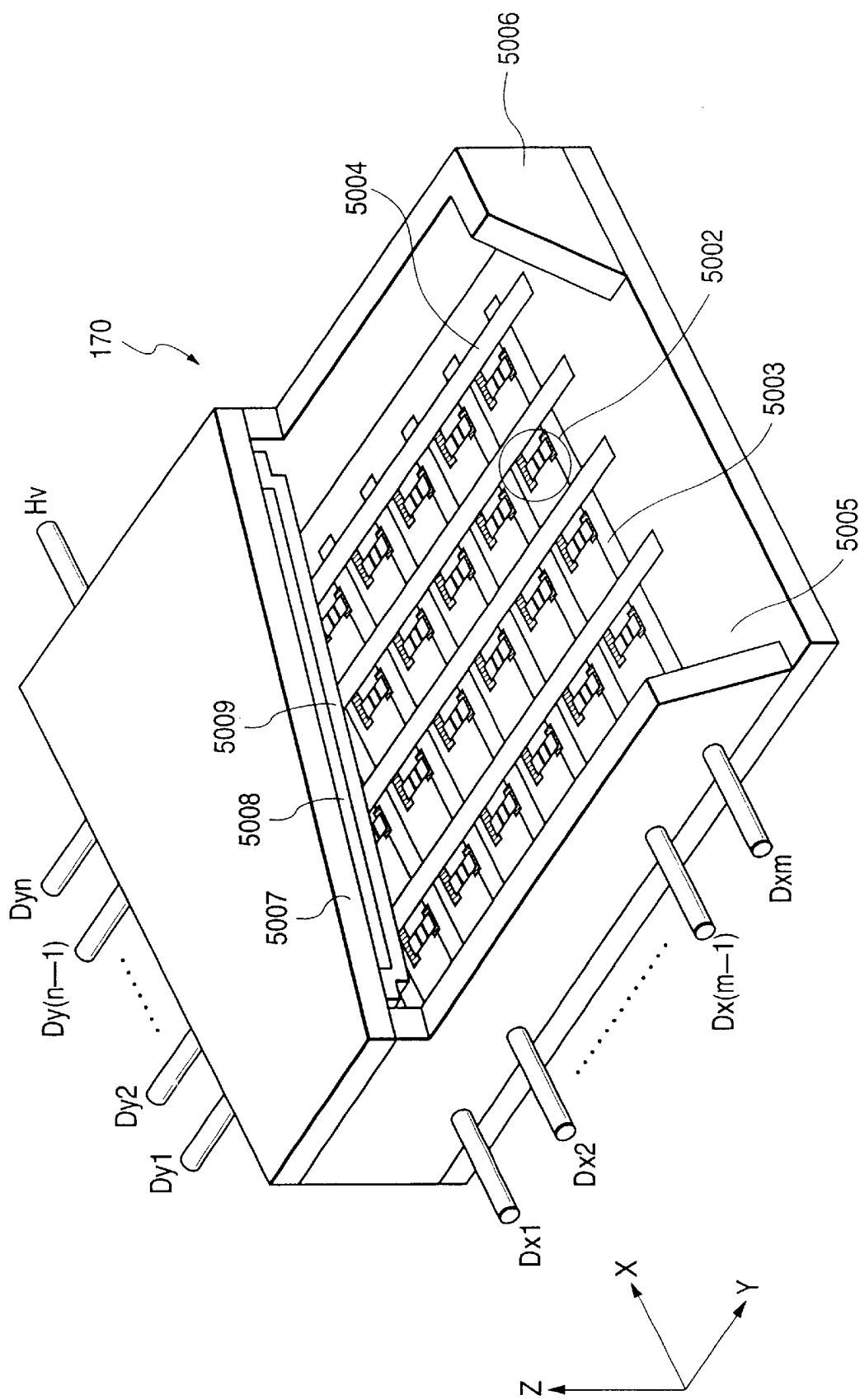
FIG. 6 is a perspective view of an image-forming apparatus to which the present invention is suitably applicable.

Example 8 is an example of the wiring board such as a print-circuit board, a circuit board, or the like, and FIG. 3A to FIG. 3C are plan views for successively explaining the production steps of the wiring substrate, which illustrate only a part of the wiring substrate in order to avoid complexity.

For producing this wiring substrate, the X-directional wires 4 were made in 100 column lines on the substrate 9 of soda lime glass cleaned well (FIG. 3A). The X-directional wires 4 were made by forming the pattern with the silver paste by the screen printing method, drying it, and baking it under the conditions of the temperature of 480° C. and the peak retention time of five minutes, and they were printed wires having the width of 100 µm and the thickness of 10 µm.

Next, the first insulating layers 51 were made by applying the insulating paste containing glass as a matrix by the printing method and baking it (FIG. 3B). The insulating paste was the aforementioned insulating paste E, which was printed, dried, and thereafter baked under the conditions of the temperature of 480° C. and the peak retention time of ten minutes.

Then the second insulating layers 52 were made by applying the insulating paste by the printing method, similar to the first insulating layers 51, and baking it (FIG. 3B). The insulating paste was the aforementioned insulating paste C, which was printed, dried, and thereafter baked under the conditions of the temperature of 520° C. and the peak retention time of ten minutes.

Further, the third insulating layers 53 were made by applying the insulating paste by the printing method, similar to the first insulating layers 51, and baking it (FIG. 3B). The insulating paste was the aforementioned insulating paste E, which was printed, dried, and thereafter baked under the conditions of the temperature of 480° C. and the peak retention time of ten minutes.

After this, the Y-directional wires 6 were made in 100 row lines on the respective third insulating layers 53 (FIG. 3C). The Y-directional wires 6 were made, similar to the Y-directional wires 4, by forming the pattern with the aforementioned silver paste by the screen printing method, drying it, and baking it under the conditions of the temperature of 430° C. and the peak retention time of ten minutes, and they were printed wires having the width of 300 µm and the thickness of 20 µm.

The wiring substrate thus completed through the above steps was inspected. As a result, it was confirmed that there was no short between the Y-directional wires 6 and the X-directional wires 4.

The present embodiment showed the example in which the insulating layers were formed between the wires 4, 6 substantially perpendicular to each other, but the production methods of the present invention are not limited to the methods of forming the wires arrayed in this matrix. For example, the present invention can also be suitably applicable to methods for producing the wiring substrate having the insulating layers between the upper and lower wires extending in the longitudinal direction along the same direction.

As detailed above, the production methods of the present invention have the following effects.

(1) A pinhole can be restrained from being formed throughout the insulating layers formed in the multiple-layer structure.

(2) The insulating layers can be formed in the multiple-layer structure without extreme deformation of the pattern.

(3) The substrate can be available at low cost.

As a result, the insulating layers for electric insulation between the wires can be made at low cost, with high reliability, and in a high yield. Likewise, the present invention can provide the wiring substrate, the matrix wiring substrate, the electron source substrate with the matrix wiring, and the image-forming apparatus with the electron source at low cost, with high reliability, and in a high yield.

What is claimed is:

1. A method for producing an electron source substrate comprising a plurality of first wires, a plurality of second wires electrically insulated through insulating layers from said first wires, and a plurality of electron-emitting devices connected to said first wires and to said second wires, on a substrate, said method comprising the following steps:

(A) a step of forming the first wires;

(B) a step of forming the insulating layers each as a stack of M layers by repeatedly carrying out steps of laying and baking an insulating material on said first wires M times, M being an integer satisfying $M \geq 3$; and (C) a step of forming the second wires on said insulating layers, wherein an N-th insulating material used in formation of an N-th insulating layer, N being an integer satisfying $2 \leq N \leq M-1$, is baked at a temperature lower than a softening point of said N-th insulating material, and wherein baking temperatures in formation of an (N+1)th to said M-th insulating layers are not more than the baking temperature in formation of said N-th insulating layer.

2. The method according to claim 1, wherein the baking temperature in formation of said M-th insulating layers is not less than a softening point of said M-th insulating material.

3. The method according to claim 2, wherein a softening point of said N-th insulating material is higher than softening points of insulating materials used for formation of said (N+1)th to said M-th insulating layers, and wherein each of the baking temperatures in formation of said (N+1)th to said M-th insulating layers is a temperature not less than a softening point of an insulating material used for formation of each corresponding insulating layer.

4. The method according to claim 3, wherein softening points of insulating materials used for formation of said N-th to said M-th insulating layers decrease in ascending order from said N-th to said M-th layers, and wherein said baking temperature of each layer is always kept lower than a softening point of a lower insulating layer.

5. The method according to claim 1, wherein a baking temperature in formation of the first insulating layer is not less than a softening point of the first insulating material.

6. The method according to claim 5, wherein softening points of a first to said (N−1)th insulating layers, or softening points of insulating materials used for formation of a first to said (N−1)th insulating layers are not less than the N-th baking temperature.

7. The method according to claim 5, wherein softening points of a first to said (N−1)th insulating layers, or softening points of insulating materials used for formation of a first to said (N−1)th insulating layers are temperatures not more than the N-th baking temperature.

8. The method according to claim 5, wherein softening points of a first to said (N−1)th insulating layers, or softening points of insulating materials used for formation of a first to said (N−1)th insulating layers are substantially identical with the N-th baking temperature.

9. The method according to claim 1, wherein a longitudinal direction of said first wires is substantially perpendicular to a longitudinal direction of said second wires.

10. A method for producing an image-forming apparatus in which an electron source substrate comprising a plurality of first wires, a plurality of second wires electrically insulated through insulating layers from said first wires, and a plurality of electron-emitting devices connected to said first wires and to said second wires on a substrate is opposed to a substrate with an image-forming member placed thereon, wherein said electron source substrate is produced by the method as set forth in any one of claims 1 to 9.

11. An electron source substrate comprising:
   (A) a substrate;
   (B) a plurality of first wirings arranged on said substrate;
   (C) an insulating layer arranged on said plurality of first wirings;
   (D) a plurality of second wirings intersecting said first wirings; and
   (E) a plurality of electron-emitting devices connected to said first and second wirings, wherein
      said insulating layer comprising a lowest layer contacting said first wiring, uppermost layer contacting said second wirings, and an intermediate layer arranged between said lowest layer and said uppermost layer, with said intermediate being more porous than said lowest and uppermost layers.

12. A display comprising:
   an electron source substrate according to claim 11; and
   a phosphor emitting light responsive an electron emitted from said electron-emitting device.

13. A method for producing a wiring substrate in which a first wire and a second wire are laid through an insulating layer on a substrate, said method comprising the following steps:
   (A) a step of forming the first wire;
   (B) a step of forming the insulating layer as a stack of M layers by repeatedly carrying out steps of laying and baking an insulating material on said first wire M times, M being an integer satisfying M≧3; and
   (C) a step of forming the second wire on said insulating layer,
   wherein an N-th insulating material used in formation of an N-th insulating layer, N being an integer satisfying 2≦N≦M−1, is baked at a temperature lower than a softening point of said N-th insulating material, and
   wherein baking temperatures in formation of an (N+1)th to said M-th insulating layers are not more than the baking temperature in formation of said N-th insulating layer.

14. The method according to claim 13, wherein the baking temperature in formation of said M-th insulating layer is not less than a softening point of said M-th insulating material.

15. The method according to claim 14, wherein a softening point of said N-th insulating material is higher than softening points of insulating materials used for formation of said (N+1)th to said the M-th insulating layers, and
   wherein each of the baking temperatures in formation of said (N+1)th to said M-th insulating layers is a temperature not less than a softening point of an insulating material used for formation of each corresponding insulating layer.

16. The method according to claim 15, wherein softening points of insulating materials used for formation of said N-th to said M-th insulating layers decrease in ascending order from said N-th to said M-th layers, and
   wherein said baking temperature of each layer is always kept lower than a softening point of a lower insulating layer.

17. The method according to claim 13, wherein a baking temperature in formation of a first insulating layer is not less than a softening point of a first insulating material.

18. The method according to claim 17, wherein softening points of a first to said (N−1)th insulating layers, or softening points of insulating materials used for formation of a first to said (N−1)th insulating layers are not less than the N-th baking temperature.

19. The method according to claim 17, wherein softening points of a first to said (N−1)th insulating layers, or softening points of insulating materials used for formation of a first to said (N−1)th insulating layers are temperatures not more than the N-th baking temperature.

20. The method according to claim 17, wherein softening points of a first to said (N−1)th insulating layers, or softening points of insulating materials used for formation of a first to said (N−1)th insulating layers are substantially identical with the N-th baking temperature.

21. A method for producing a matrix wiring substrate in which a first wire and a second wire are laid substantially perpendicular to each other on a substrate and in which an insulating layer is placed at an intersecting point between said first and second wires, wherein said first wire, second wire, and insulating layer are produced by the method as set forth in any one of claims 13 to 20.

22. A wiring substrate comprising:
   (A) a substrate;
   (B) a plurality of first wirings arranged on said substrate;
   (C) an insulating layer arranged on said plurality of first wirings; and
   (D) a plurality of second wirings arranged over said first wirings, wherein
      said insulating layer comprises a lowest layer contacting said first wirings, an uppermost layer contacting said second wirings, and an intermediate layer arranged between said lowest layer and said uppermost layer, with said intermediate layer being more porous than said lowest layer and said uppermost layer.

23. A matrix wiring substrate comprising:
   (A) a substrate;
   (B) a plurality of first wirings arranged on said substrate;
   (C) an insulating layer arranged on said plurality of first wirings; and
   (D) a plurality of second wirings interesecting said plurality of first wirings, wherein
      said insulating layer comprises a lowest layer contacting said first wiring, and uppermost layer contacting said second wirings, and an intermediate layer arranged between said lowest layer and said uppermost layer, with said intermediate layer being more porous than said lowest layer and said uppermost layer.

* * * * *

UNITED STATES PATENT AND TRADEMARK OFFICE
CERTIFICATE OF CORRECTION

PATENT NO.     : 6,604,970 B1
DATED          : August 12, 2003
INVENTOR(S)    : Shuji Yamada It is certified that error appears in the above-identified patent and that said Letters Patent is hereby corrected as shown below:

Title page,
Item [56], References Cited, FOREIGN PATENT DOCUMENTS,
"JP 09283010 A * 10/1997" should read -- JP 09-283010 A * 10/1997 --, and
"JP 09283061 A * 10/1997" should read -- JP 09-283061 A * 10/1997 --.
OTHER PUBLICATIONS, after "H. Araki, et al., "Elecroforming" should read
-- Electroforming --.

Column 2,
Line 17, "florescent" should read -- fluorescent --.

Column 19,
Line 31, "wiring" should read -- wirings --.
Line 38, "responsive" should read -- responsive to --.
Line 65, "the M-th" should read -- M-th --.

Column 20,
Line 60, "wiring" should read -- wirings --.

Signed and Sealed this

Ninth Day of December, 2003

JAMES E. ROGAN
*Director of the United States Patent and Trademark Office*